United States Patent [19]

Haken

[11] Patent Number: 5,141,890
[45] Date of Patent: Aug. 25, 1992

[54] CMOS SIDEWALL OXIDE-LIGHTLY DOPED DRAIN PROCESS

[75] Inventor: Roger A. Haken, Richardson, Tex.

[73] Assignee: Texas Instruments Incorporated, Dallas, Tex.

[21] Appl. No.: 844,925

[22] Filed: Mar. 27, 1986

Related U.S. Application Data

[63] Continuation of Ser. No. 665,495, Oct. 29, 1984, abandoned, which is a continuation of Ser. No. 468,917, Feb. 23, 1983, abandoned, which is a continuation-in-part of Ser. No. 344,588, Feb. 1, 1982, Pat. No. 4,442,591.

[51] Int. Cl.$^5$ .......................................... H01L 21/336
[52] U.S. Cl. ...................................... 437/44; 437/34; 437/57; 437/29; 437/30; 357/23.3
[58] Field of Search ............... 437/27, 28, 29, 30, 437/34, 40, 41, 44, 56, 57, 186, 235, 238; 357/23.3

[56] References Cited

U.S. PATENT DOCUMENTS

| | | | |
|---|---|---|---|
| 4,382,827 | 5/1983 | Romano-Moran et al. | 437/34 |
| 4,385,947 | 5/1983 | Halfacre et al. | 437/57 |
| 4,433,468 | 2/1984 | Kawamata | 437/44 |
| 4,442,591 | 4/1984 | Haken | 437/41 |
| 4,577,391 | 3/1986 | Hsia et al. | 437/44 |
| 4,590,663 | 5/1986 | Haken | 437/34 |
| 4,657,602 | 4/1987 | Henderson, Sr. | 437/57 |
| 4,753,898 | 6/1988 | Parrillo et al. | 437/44 |

Primary Examiner—M. Wilczewski
Attorney, Agent, or Firm—James C. Kesterson; B. Peter Barndt; Richard L. Donaldson

[57] ABSTRACT

A CMOS process wherein lightly doped drain extensions are fabricated in the N-channel devices without any additional masking steps. The present invention requires a specific sequence of steps, after all steps through patterning of the polysilicon gate level have been completed: first, a light shallow N-type implant is performed overall. Next, oxide is deposited overall. Second, photoresist is patterned according to the P-type source/drain mask. The exposed conformal oxide is etched away completely, and the P-type source/drain implant is performed. Third, after the P-type source/drain photoresist is removed, the conformal oxide is anisotropically etched to leave sidewall oxide filaments, the N+ source/drain masking layer is applied, and the N+ source/drain implant is performed. This process results in short lightly doped drain extensions on the source/drain regions of the N-type devices only and not of the P-type devices. Alternatively, the conformal oxide is not deposited until after the p+ source/drain resist is removed, so that the PMOS devices also have sidewall oxides (for better topography), but not lightly doped drain extension.

5 Claims, 3 Drawing Sheets

- 3000 Å LPCVD OR PLASMA OXIDE DEPOSITED
- P$^+$ S/D PATTERNED, EXPOSED OXIDE ETCHED, P$^+$ S/D IMPLANT

- N$^+$ S/D PATTERNED AND EXPOSED LPCVD OXIDE PLASMA ETCHED SUCH THAT THE SIDEWALL OXIDE ON POLY GATES IS LEFT INTACT.
- N$^+$ S/D IMPLANT, As ~ 1x10$^{16}$/cm$^2$
- NORMAL PROCESSING RESUMED

- $N^+$ S/D patterned and exposed LPCVD oxide plasma etched such that the sidewall oxide on poly gates is left intact.
- $N^+$ S/D implant, As ~ $1\times10^{16}/cm^2$
- Normal processing resumed

CMOS SIDEWALL OXIDE-LIGHTLY DOPED DRAIN PROCESS

CROSS REFERENCE TO RELATED APPLICATIONS

The present application is a continuation of U.S. application Ser. No. 665,495, filed Oct. 29, 1984, now abandoned, which is a continuation of U.S. application Ser. No. 468,917, filed Feb. 23, 1983, also abandoned, which is a continuation-in-part of U.S. application Ser. No. 06/344,588, filed Feb. 1, 1982, now U.S. Pat. No. 4,442,591.

BACKGROUND AND SUMMARY OF THE INVENTION

The present invention relates to a CMOS integrated circuit technology.

A recognized difficulty with both short-channel and high-voltage MOS technologies is impact ionization at the drain/channel boundary, since the high peak electric fields normally encountered in this location lead to injection of hot carriers into the gate oxide (producing a shift in he device threshold according to the devices operating history), and to reduced avalanche breakdown voltage, and to increased parasitic substrate current. The electric filed generated by the gate exacerbates the problem of avalanche breakdown into the drain boundary, and this is particularly severe if the drain boundary is very close to the gate corner, where the gate field is normally at a maximum. All these effects are particularly, difficult in the N-channel devices in CMOS technology, both at small geometries (e.g. 1 micron channel length at 5 volts) and at high voltages (4 microns channel length at 20 volts).

In digital CMOS circuits parasitic substrate currents caused by impact ionization flow during the switching transients when both N and P-channel devices are turned on. This can give rise to 'substrate bounce' which could cause latch-up, debiasing or the discharge of floating nodes. (These are more good reasons for using epi on a P+ substrate). In analog circuits the situation is potentially more serious since N-channel source follower type configurations could be biased such that a significant parasitic substrate current flows continuously. Perhaps the most serious effect of all is hot carrier injection into the gate oxide which can cause long term threshold shifts and transconductance degradation. Of course, all these problems become more severe as the gate oxide is scaled while the supply voltage is kept constant.

Since the coefficient of impart ionization is approximately an order of magnitude higher for electrons that for holes, the N-channel device is the limitation to realizing short channel devices for high voltage applications. The present invention teaches CMOS techniques for making the N-channel device in a CMOS process 'hot-carrier resistant'. These techniques introduce lightly doped N regions between the channel and the N+ source/drain regions. This structure spreads the high electric filed at the drain pinch-off region into the N− extension, thereby increasing the drain breakdown voltage, reducing impact ionization, and consequently reducing hot-electron emission. These advantages are realized at the cost of a low dose phosphorus blanket implant, no extra masking steps are required.

Significant attention has been paid to problems of this nature in the prior art of NMOS devices. For example, U.S. Pat. No. 4,356,040, which is hereby incorporated by reference, teaches the use of gate sidewall oxide to reduce the gate/drain overlap, or to provide for gate/drain underlap. Ogura et al, "Design and Characteristics of the Lightly Doped Drain/Source (LDD) Insulated Gate Field-Effect Transistor," IEEE Journal of Solid State Circuits, Volume SC-15, Pages 424 and following (1980) together with references cited therein, all of which are hereby incorporated by reference, discloses the structure of lightly doped drain regions and discusses their advantages. Other art is believed to expressly teach the formation of a lightly doped drain region which is formed by a reachthrough source/drain implant which is partially screened by a sidewall oxide.

The incorporation of a lightly doped drain structure in a CMOS process presents several peculiar problems, and it is these specific problems which the present invention addresses.

In particular, it is an object of the present invention to provide a method for forming lightly doped drain extension regions (LDD regions) in a CMOS technology.

It is a further object of the present invention to provide a method for fabricating LDD regions in a CMOS technology, without requiring any additional masking steps.

A particular difficulty in CMOS technology, as discussed above, is that only the N-channel devices need the LDD region at the drain boundary, since the impact ionization coefficient for holes is far lower than for electrons, as discussed above.

Thus, it is an object of the present invention to provide a method for fabricating CMOS devices in which the N-channel devices incorporate LDD regions, whereas the P-channel devices do not.

It is a further object of the present invention to provide a method for fabricating CMOS devices wherein the N-channel devices but not the P-channel devices incorporate lightly doped drain regions, without requiring any additional masking steps.

A further problem with the use of lightly doped drain regions is that they degrade device characteristics in several ways. In particular, the series resistance of the device can be increased substantially, and the transconductance of the device will also be lower. Both of these effects are sensitive to the length of the LDD regions. That is, it is desirable that the LDD extension regions not be much longer than is necessary, considering the operating voltage of the device. In particular, if the LDD regions are not self-aligned to the gate and source/drain regions, then the LDD regions must be at least two alignment tolerances wide, since otherwise normal alignment variation could produce some devices which had no LDD region at all. These devices would be inoperative and degrade yield. Thus, it is highly desirable that the lightly doped drain extension regions be self-aligned to the gate and also to the source/drain regions.

It is a further object of the present invention to provide a CMOS processing technology wherein lightly doped drain extension regions are self-aligned to both the gate and to the source/drain regions.

It is a further of the present invention to provide a CMOS technology wherein lightly doped drain extension regions are self-aligned both to gate regions and to source/drain regions in N-channel devices only and do not occur in P-channel devices, without requiring any additional masking steps.

The above problems are particularly acute with high voltage devices. High voltage CMOS devices are highly attractive for many applications, including consumer devices, control devices, and devices for environments where electrical noise is very high. However, it is quite difficult to get the geometries of a high voltage CMOS process down to geometry suitable for LSI density. In addition, the mask counts for the high-voltage CMOS process must be very carefully controlled, since even a technologically possible chip is useless unless the cost per chip as-fabricated times the yield produces an acceptably low net cost figure. That is, a crucial parameter in high voltage CMOS applications is the combination of low mask count and small geometries.

Thus, it is an object of the present invention to provide a high voltage CMOS process having very low mask count and relatively small geometries.

The length of the LDD region can be particularly critical in a high voltage CMOS process. This is because, in a very high voltage process, a low dopant concentration will be typically used in the LDD region to achieve the necessary gradual doping profile at the channel/LDD boundary, but such low dopant concentrations necessarily imply a very high resistively within the LDD region itself, and therefore the series resistance of the device will be drastically degraded as the length of the LDD region is increase. On the other hand, it is necessary that the LDD region in a very high voltage device not be too short, since the desired gradual dopant profile may thereby be truncated. That is, use of non-self-aligned LDD regions may be optimal in a high voltage process because the substantial total width of the source and drain side LSS's impose a total additional series resistance in the device which is significantly larger than that required if the LDD width on both sides were merely minimal.

According to the present invention there is provided:

A method for fabrication of a CMOS device, comprising the steps of:

providing a semiconductor substrate;

defining moat regions at the surface of said substrate;

introducing N-type impurities into selected portions of said substrate to form a plurality of N-tank regions;

forming an insulated conductive gate layer over portions of said substrate to define a predetermined plurality of device locations within said moat regions, said device locations comprising both N-channel locations regions and P-channel device locations;

(a) introducing a light dose of an N-type dopant into a shallow depth of said substrate surface overall, both in desired locations of lightly doped drain extension regions and in other locations;

depositing a conformal oxide overall;

(b) providing a patterned mask layer to cover the locations of said N-channel devices, removing said conformal oxide where not covered by said masking layer, introducing a heavy dose of P-type impurities to form P-type source/drain regions in predetermined locations where the surface of said substrate is exposed, and removing said first masking layer;

(c) depositing a patterned masking layer to cover a plurality of said P-channel device locations, anisotropically etching said conformal oxide over said N-type device regions to leave sidewall oxides at the sidewalls of said gates over said N-type device regions, and implanting a high dose of an N-type impurity to form N-type sources and drains, whereby said N-channel devices comprise a lightly doped drain extension region separating said respective source/drain regions thereof from said respective channel regions thereof; and connecting said respective source/drain and gates to provide a desired circuit function;

wherein all of step (a) is performed before step (6), and all of step (6) is performed before step (c).

BRIEF DESCRIPTION OF THE DRAWINGS

The present invention will be described with reference to the accompanying drawings, wherein.

DESCRIPTION OF THE PREFERRED EMBODIMENTS

Figure 1:
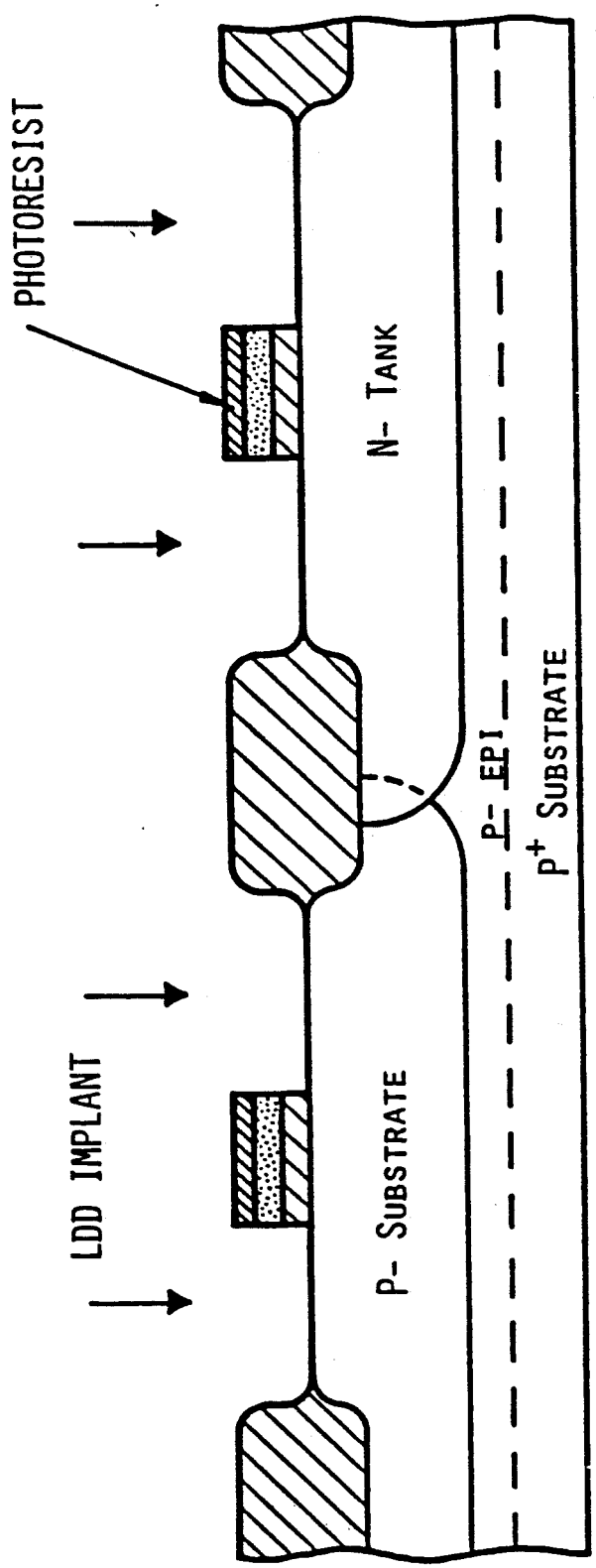
FIGS. 1-3 show the sequence of steps used to form P-channel devices which have source/drain self-aligned to the gate without lightly doped drain extension regions, and to form N-channel devices which have lightly doped drain extension regions self-aligned to the gate and to the N-type source/drain.

The present invention will be described with reference to a high-voltage CMOS process which is optimized for 18 volt operation with 4 micron channel length. However, the process of the present invention can be scaled to higher or lower operating voltages in a straightforward fashion. That is, the high voltage CMOS process of the presently preferred embodiment can be easily scaled to a 10 volt 2 micron process or a 14 volt 3 micron process, as will be discussed below. Moreover, the critical sequence of steps in which the N and P type source/drain and LDD extension regions ar formed can be inserted in other high voltage CMOS processes. That is, while it is preferred to use an epitaxial twin tub process with a shallow highly doped tank, none of these features are strictly necessary.

The sequence of process steps which achieves formation of source and drain and LDD extension regions according to the present invention will be described first, and the general high voltage CMOS process flow on which the presently preferred embodiment relies will be described next.

The preferred process flow up through patterning of the polysilicon gate level is, in the presently embodiment, essentially identical with that described in parent application Ser. No. 06/344,588, "HIGH VOLTAGE CMOS PROCESS", filed Feb. 1, 1982, which is hereby incorporated by reference, now U.S. Pat. No. 4,442,591.

After the polysilicon gate level has been patterned, the exposed thin gate oxide is preferably not stripped, since the lightly doped drain implant (the LDD implant) is preferably performed as a reachthrough implant through the gate oxide. (The reason the gate oxide is not stripped is to preserve gate oxide integrity.) However, this point is of minor importance here.

After polysilicon patterning the exposed gate oxide is etched away while the photoresist on the poly is left in place. A light phosphorus or arsenic implant is then performed, e.g. $8 \times 10^{12} cm^2$ phosphorus at 60 keV, which is self-aligned to the poly gate edge, FIG. 1.

Phosphorus is believed to be slightly preferable to arsenic for the lightly doped drain implant, since the greater diffusivity of phosphorus will provide a more gradually changing doping profile at the channel/LDD junction.

Use of an LDD implant which includes both arsenic and phosphorus is a further embodiment of the invention, which again provides an even more gradual doping transition at the LDD/channel boundary. That is, since phosphorus has a higher diffusivity than arsenic, a region including only phosphorus will exist just beyond the peripheral of the region containing both phosphorus and arsenic. Again, this spreads the potential and reduces the peak electric field.

In general, the depth and dosage of the LDD implant is selected to achieve a depth in the LDD regions which is somewhat less than the depth of the source regions, and a dopant concentration which is mush less than the dopant concentration normally used for a source drain. For example, in the presently preferred embodiment, where 4 micron devices are sued for 18 volt operation, the dopant concentration in the lightly doped drain regions is approximately 1E 17 per cubic centimeter, and the depth of the lightly doped drain region is approximately 0.15-0.2 micron. Deeper LDD regions would work perfectly will (as long as the LDD is not very much deeper than the source/drain depth), but deeper LDD regions impose greater difficulty in control of the lateral diffusion of the LDD implant.

Structurally, the lightly doped drain region serves essentially these functions: first, the change in the dopant profile at the channel/LDD boundary should be gradual. As noted above, this gradual change in the doping profile also implies a more gradual change in the potential, and therefore a reduction in the peak electric field. Second, the heavily doped drain is physically removed from the gate corner, so that the drain corner sees a substantially smaller electric field from the gate voltage. That is, the transition into the heavily-doped (typically 1E19 per cc) drain region, when LDD regions are not used, occurs in close physical proximity to the maximum of the gate-induced electric field (at the gate corner), so that mere physical separation of the high-low junction at the LDD/drain boundary is itself advantageous. Third, the LDD region itself will typically be lightly enough doped to impose a slight additional IR voltage drop between the channel and drain, and, although this voltage drop degrades device performance, it does provide a further slight reduction (e.g. a volt or so) in the voltage drop at the LDD/channel boundary. Fourth, the wider physical separation of the source and drain supplied a slightly larger punch through voltage. Fifth, the LDD reduces the capacitive loading seen by the gate and thus tends to improve the speed of operation.

Where a double implant is used, the respective energies would preferably be selected to give the same stopping distances for the phosphorus and the arsenic implant. In this case, the total dopant concentration within the LDD region can be selected to be up to in the neighborhood of 1E18 per cubic centimeter. However, as noted, the resistively (dopant concentration) of the LDD regions can be varies to optimize the present invention for particular desired circuit constraints. That is, a lower dosage LDD implant will provide a more gradual dopant profile at the LDD/channel boundary, and therefore a reduced peak electric field at this boundary, but the price for this is degraded transconductance and series resistance.

If a double implant (phosphorus plus arsenic) is used, the more desirable of these effects is increased, as noted above. The undesired side effects of LDD regions can be reduced. That is, where a phosphorus plus arsenic implant is used to form the LDD regions, a slightly higher total dopant concentration within the LDD regions can be sued than would to possible with a phosphorus implant only, and a series resistance degradation due to the high resistively LDD regions can be minimized.

Figure 2:
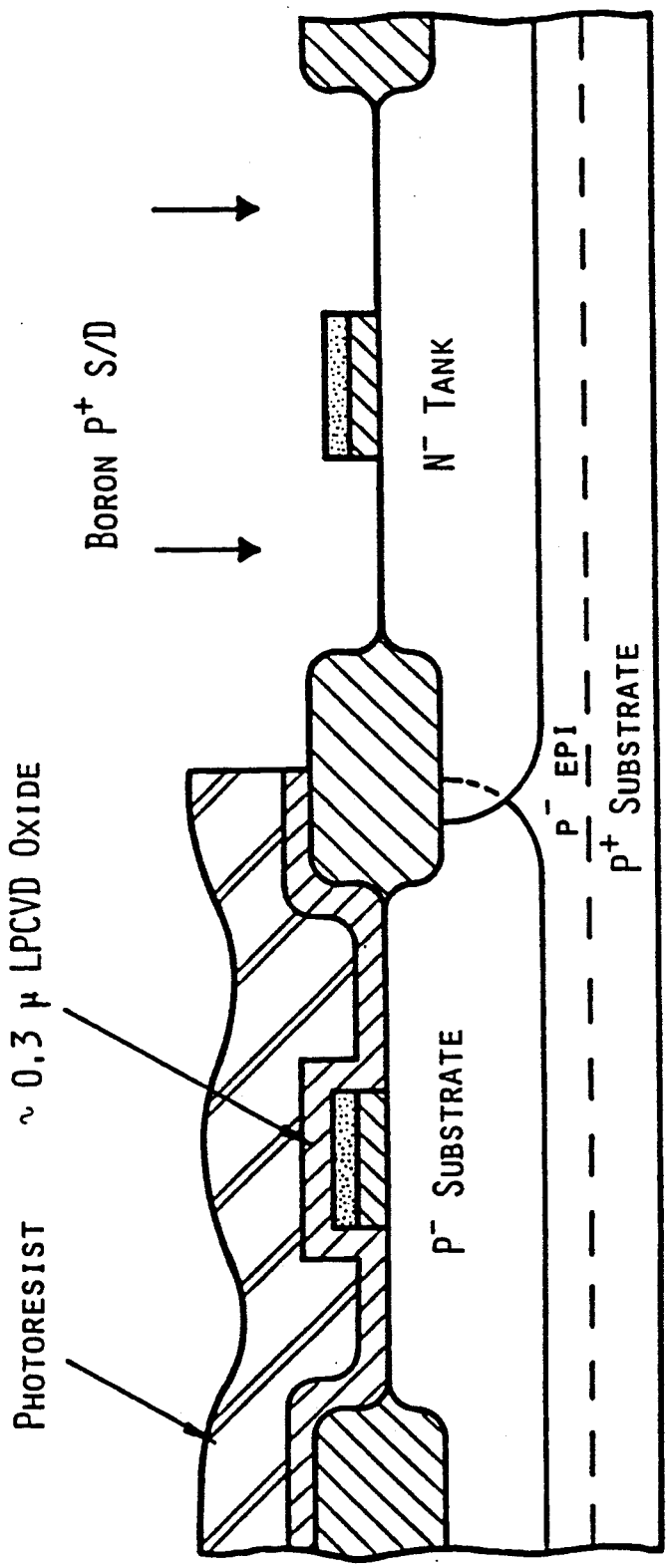

After the blanket LDD implant has been performed, as shown in FIG. 1, a thin layer of oxide is conformerly deposited overall, e.g. by plasma or low pressure chemical vapor deposition. In the presently preferred embodiment, 300 nanometers of oxide are deposited, but this thickness is not at all critical. However, good control over the exact oxide thickness deposited is highly desirable in connection with the width of the sidewall oxides, as will be discussed below. After the oxide is into place, the mask for the P+ source/drain implant is applied. The exposed conformal oxide is etched away, and the P+ source/drain implant is then applied, e.g. 8E15 per square centimeter of boron diflouride at 67 keV, as shown in FIG. 2.

The photoresist which was used to mask the P-type source/drain implant is now stripped, and the conformal oxide over the NMOS device regions is partially etched away leaving filaments on the gate sidewalls, and the mask for the N-type implant is then applied. The sequence of these steps is not at all critical, that is the mask for the N+ implant could be applied before the oxide etch is performed. However, the parameters of the oxide etch are important.

It is necessary that the polysilicon gate level be patterned to leave nearly vertical sidewalls, so that a highly anisotropic polysilicon etch should be used. Many such etches are will known in the art, e.g. the polysilicon could be etched in Freon-11.

Figure 3:
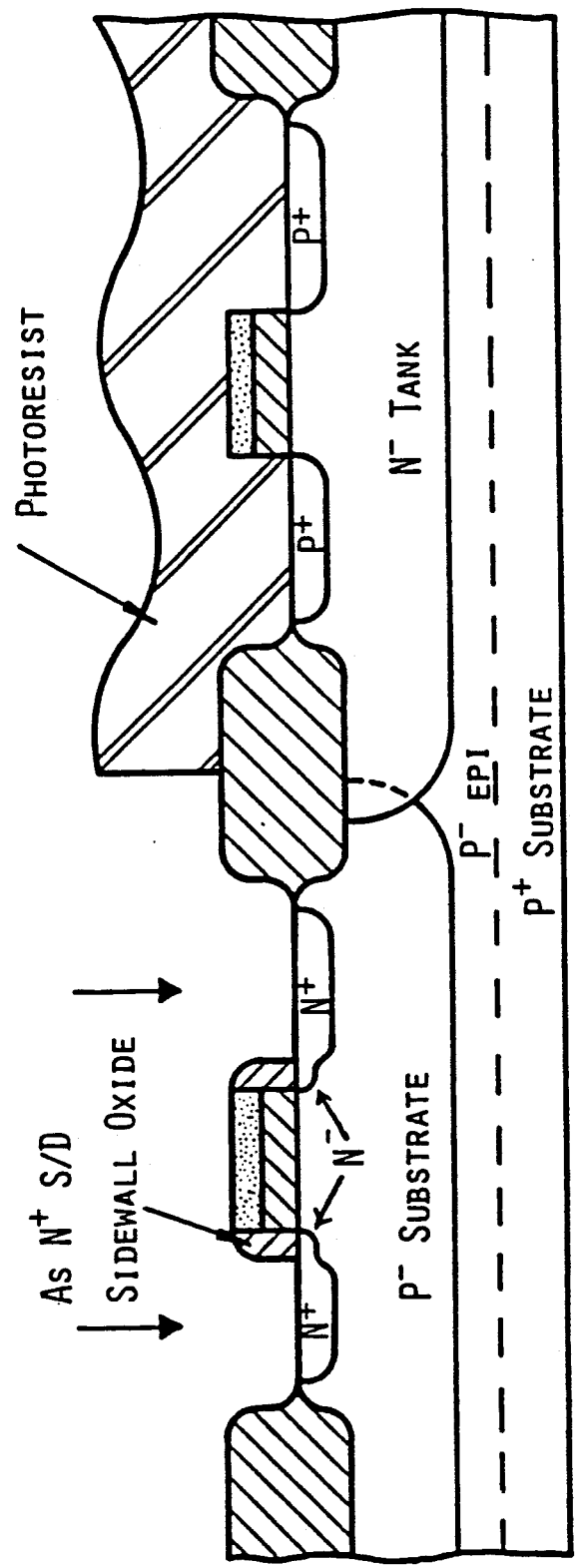

The existance of the vertical sidewall along the poly gatelines means that substantial oxide filaments will exist at the gate sidewalls after oxide has been cleared everywhere else. That is, if 300 microns of oxide are deposited conformally and then 300 microns are etched away, the gate sidewalls will still have a coat of oxide which is approximately as wide as the original oxide thickness (300 nanometers) and as high as the thickness of the gate plus gate insulator, as shown in FIG. 3. Preferably the sidewall is etched slightly more than necessary to clear it, e.g. 50% overetch. This will still leave substantial sidewall oxide filaments, without leaving any undesired other oxide filaments, e.g. on the filed oxide. (It should be noted that the field oxide in the LOCOS process is typically substantially less vertical than that shown here, which has been compressed for compactness. Of course, the present invention may be practices with a wide variety of isolation technologies, and is not by any means limited to a locos process.)

If the conformal oxide is overetched beyond that desired, the height of the sidewall oxides will be lowered, and their thickness will also be diminished slightly. However, since the presently preferred embodiment of the invention does not use a reachthrough implant through the sidewall oxide, the exact height of the sidewall oxide is unimportant, as long as it is reasonably substantial (i.e. more than 4 times the thickness of the gate oxide). Moreover, the width of the sidewall oxide, as is well known in the art, is only slowly sensitive to overetching, so that inaccuracy in the etching duration or in the thickness of conformal oxide originally deposited produces only minor variation in the width of the LDD extension regions.

Thus, the arsenic source/drain implant is finally performed, e.g. 1E16 per centimeter squared at an energy of 100 keV.

The high voltage CMOS process with which the preferred embodiment of the present invention is embodied will now be described in detail. The LDD formation according to the present invention can also be used with other high voltage CMOS processes, but the combination of LDD formation according to the present invention with the high-voltage process described has substantial advantages. In particular, the present invention provides denser devices at the same operating voltage at the same density.

It should be noted that, while the channel length is decreased by the use of LDD extensions, the other operating parameters remain the same. That is, such parameters as P+ to tank edge spacing are not affected by the introduction of the LDD extension regions.

The present invention will be described with primary reference to a process which is optimized for a device which will operate at 18 volts, so that breakdown voltages and field thresholds of 20 volts or better are required. In this preferred embodiment, 4 micron design rules are used. However, the present process also scales directly to lower voltage operation at smaller geometries, for example to 15-volt operation at 3 micron geometries.

The present invention preferably uses a P-on-P+ structure, with both a P-well and an N-tank being implanted within the P-epitaxial layer.

The present invention permits a 9 mask double-poly process using positive resist, or a 10 mask process using negative resist (since two masking steps ar used to form the contact level). Algorithmic mask generation reduces the number of drawn levels to 8, and permits contact to the tank to be made using the N+ source/drain implant, and contact to the P-well using the p+ source/drain implant. The N+ and P+ S/D masks are both generated from a drawn N+/P+ mask and the tank mask. A single-poly process according to the present invention uses only 8 masks. The starting material is a P+ substrate, doped to about $10^{18}$ per cm$^3$, with a 16 micron thick p-type epitaxial layer thereon, doped to about $10^{15}$ per cm$^3$. Evaluation of latchup performance using the process of the present invention indicates that 16 micron epi gives adequate latchup protection for 15 volt operation of internal circuits. For I/O circuits, further protection can be achieved by the addition of guard rings which are implanted with the N+ source/drain implant. Although this requires the use of metal jumpers int eh I/O circuits to permit a poly line to cross between P and N channel devices, the area penalty is very small as a percentage of chip size. By providing guard ring structures only in the I/O circuits, which are more likely to receive externally generated high-voltage transients, good resistance to high-voltage transients is provided without significantly increased process complexity or area inefficiency.

Two layers of poly are sued, with a regrown gate oxide. The first polysilicon level can be doped by ion implantation, and is therefore suitable for capacitor bottom plates and for natural $V_T$ transistors. In addition, resistors can be formed in this first poly level. The second level of polysilicon is used for regular gates and interconnects. It is this level of polysilicon which provides the gates to which the LDD regions of the N-channel high-voltage transistors are self-aligned. This level is preferably silicided by the coevaporation of titanium and silicon, so that the sheet resistance of the second poly layer is effectively reduced to around 5 ohms per square. This avoids the difficult compromise between resistively and etching characteristics which is otherwise necessary. When polysilicon is POCl$_3$ doped to below about 50 ohms per square, plasma etching tends to proceed selectively along grain boundaries, in effect removing the polysilicon in chunks. Polysilicon having 50 ohms per square sheet resistance is bad enough for circuit design, but portions of the poly may be exposed to the P-type source/drain implant, and would therefore have an even higher sheet resistance. Siliciding the second poly level avoids the sheet resistance problem, and siliciding by means of co-deposition of titanium and silicon adds almost no additional process complexity.

The final P-channel (N-tank) surface concentration is around $10^{16}$ per cm$^3$, and the tank depth is about 4 microns. With a gate oxide thickness of 70 nm, the resulting body effect is about $1.4V^{\frac{1}{2}}$, and the $K_P$ is 5 microamps per volt$^2$. For the majority of circuit designs, the high P-channel body effect is not an issue, since the N-tank can always be returned to the source.

The final N-channel (P-well) surface concentration is around $2 \times 10^{15}$ per cm$^3$, with a resulting body effect of $0.4V^{\frac{1}{2}}$ and a $K_P$ of 16 microamp per volt$^2$.

A blanket boron implant is used to simultaneously set the $V_{TN}$ (the NMOS threshold voltage) and $V_{TP}$ to plus and minus 1.5 volt. A blanket implant can be used to symmetrize the PMOS and NMOS threshold voltages at only one voltage level, and plus and minus 1.5 volts happen to be paired values conveniently available with the process parameters specified.

The PMOS and NMOS field thresholds are both around 22 volts or greater. This is achieved with a 1.1 micron field oxide, ad a blanket boron field threshold adjust implant. The initial field threshold in PMOS regions is higher than required, and the threshold adjust implant dose is selected to equalize the filed threshold in PMOS and in NMOS regions. With doping levels as described above, the field threshold levels are equalized at around 22 through 25 volts. Thus, no masking step is required for field threshold adjustment.

The PMOS and NMOS source/drains are implanted with boron and with phosphorus/arsenic respectively, yielding junction depths around 0.75 micron with junction breakdown voltages around 23 volts.

The mask set of the preferred embodiment is therefore as follows:

TABLE 1

| Twin Tub, 15 V, Two-Level Poly CMOS - Mask Set | |
|---|---|
| Mask Name | Function |
| 1. Tank | Defines P-channel regions and can be used for resistors. |
| 2. Moat | Defines moat pattern for active devices and N+ guard rings for I/O circuits. |
| 3. Poly 1 | Used for precision capacitor bottom electrodes interconnect and natural $V_T$ transistors. |
| 4. Poly 2 | Used for regular transistors, capacitor top electrodes and interconnect. |
| 5. N+ S/D | N-channel S/D, N+ guard ring for I/O circuits and tank contact. |
| 6. P+ S/D | P-channel S/D and local P-substrate contact. |
| 7. CTOR | Contact to all poly gates and moat. |
| 8. Metal | Full level of interconnect. |
| 9. POR | Protective overcoat. |

The baseline process flow for the high voltage CMOS process is illustrated in FIGS. 1-8. Starting material is a P+ substrate, doped to about $10^{18}$ per cm$^3$, with a 16 micron epitaxial P-type layer, doped to around $10^{15}$ per cm$^3$. The thickness of the epitaxial layer is controlled by several factors: First, the thicker the layer, the less effective it will be in suppressing latchup; second, the minimum thickness of the epi-layer is determined by the supply voltage, such that with the N-tank at $V_{DD}$ (+15V) and the P-substrate (epi) at 0V, the depletion region extending from the tank does not quite reach the P+ substrate. This minimizes the depletion region extending into the tank, thereby increasing the P+ punch thru voltage, and ensures that no voltage is dropped across th P+ substrate which could cause breakdown because of the high fields. Moreover, the thinner the layer, the greater the leakage current and capacitative coupling into the substrate may be.

The epitaxial layer doping is selected as discussed in U.S. patent application Ser. No. 06/327,661, filed Dec. 4, 1981, which is hereby incorporated by reference, now abandoned.

The gain (beta) product of parasitic bipolar transistors produced by the present process is greater than unity, so that avoidance of latch-up depends on never reaching the necessary injection current. This is averted by current leakage through the substrate: the lower the resistance of this leakage path, the more any current surge will be shunted. Lateral spacings which safely avoid latch-up are, in the 15V case: 5 microns tank-to-N+, and 7 microns tank-to-P+. These scale directly with device geometry.

A 50 nm initial oxide is grown, and 140 nm of silicon nitride is deposited. These layers are etched using the tank-complement image, and the N-tank is implanted, using e.g. $5 \times 10^{12}$ per cm$^2$ of phosphorus at 80 keV.

An oxide of e.g. 530 nm is grown in the N-tank region to act as a mask against the P-well implant which follows, and to act as a locater for subsequent alignments. The P-well region is then implanted with boron, at e.g. $4 \times 10^{11}$ per cm$^2$ at 60 keV.

The tank oxide is stripped and the N-tank and P-well implants are driven in. A standard pad oxide is grown and nitride is deposited. The moat-complement image is cut in the nitride/oxide stack, and a blanket boron channel stop implant is performed, of e.g. $1.2 \times 10^{13}$ per cm$^2$ at 90 keV.

The photoresist is then stripped, and field oxidation is performed to yield an oxide thickness of about 1.2 microns. The nitride/oxide stack over the moat regions is then stripped. A desirable side effect of the field oxidation step is that the boron blanket channel stop implant can be used to raise the N-channel field threshold without overly reducing the P-channel field threshold, since the phosphorus concentration int eh N-tank accumulates at the surface during the field oxidation step, whereas much of the boron in the P-well is leached into the oxide. Moreover, for the P-channel devices $Q_{SS}$ (the charge trapped in the oxide), which is always positive, increases the field threshold. This effect is particularly favorable for thick oxides, where the oxide capacitance $C_{OX}$ is necessarily small, since the voltage due to trapped charge in the oxide is $V_{SS} = Q_{SS}/C_{OX}$.

A 25 nm pre-gate oxide is then formed, to eliminate the "Kooi effect", and the pre-gate oxide is etched. A first gate oxide is then grown to a thickness of 70 nm. Optionally, a first contact pattern may also be etched at this point. A 500 nm thick first poly level is then deposited, and can be doped by using a phosphorus implant, e.g. $5 \times 10^{15}$ per cm$^2$ at 85 keV. This first level of poly is primarily intended as the bottom plate for precision poly-to-poly capacitors, as required in analog signal processing. It may also be used to form natural $V_T$ transistors, and can be used for very short interconnections, since its final sheet resistance inside the N-tank is around 150 ohms per square, and about 40 ohms per square outside the tank. (The difference is due to the counterdoping effect of the boron source/drain implant.) If a first contact is required, it can be included between the moat the first poly level.

The first poly level is then patterned and plasma etched, and the exposed gate oxide is wet etched. A second gate oxide, also 70 nm thick, is then grown in $O_2 + 5\%$ HCl. Atop the exposed first polysilicon areas, the first poly insulation oxide is simultaneously grown, to 110 nm thick. A boron blanket implant, of e.g. $5 \times 10^{11}$ per cm$^2$ at 40 keV, is used to adjust $V_{TN}$ and $V_{TP}$.

Optionally, for telecommunications circuits where depletion loads may be required (e.g. for source follower circuits), an additional masking step can be included at this stage for a depletion (phosphorus) implant.

A 300 nm thick second poly layer is now deposited and doped. 200 nm of $TiSi_2$ is deposited by co-deposition of titanium and silicon. Preferably this is done by simultaneous E-beam co-evaporation of titanium and silicon. Alternately, co-sputtering or direct reaction can be used. The titanium silicide is then annealed, and the second poly level is patterned. (Wet etching must not be done after the silicide has been deposited.) The silicide, polysilicon, and exposed gate oxide are then plasma etched. If 2 layers of poly are not required, the second layer may be omitted, and the first poly layer silicided and used for gates.

An alternative, but similar, technique to that discussed above is where the sidewall oxide is in place along the edges of the P-channel gate before the P+ source/drain implant. In this case the P-channel devices should be masked (using the regular N+ source/drain mask) prior to the arsenic LDD implant so that none of the LDD implant enters the P-channel source/drain regions. After the masked LDD implant, the sidewall oxide is deposited and etched so hat there is gate oxide underneath the sidewall oxide for both the P and N-channel devices. The P+ source/drain level is then patterned and BF2 implanted, so that it is self-aligned to the sidewall oxide edge. There is no P-type LDD or reachthrough implant. The relatively large lateral diffusion of boron caused the P+ source/drain to be aligned to the gate edge at the end of the process. The N+ source/drain level is then pattered, and the heavy arsenic N+ implant performed. Processing then continues as normal.

Note this method requires an extra mask step to prevent the LDD implant from entering the P-channel source/drain regions. It may be possible to eliminate this masking step and to rely on the boron source/drain implant to counterdope the arsenic LDD implant by lateral diffusion during the subsequent heat treatments. There is a large difference in doses: the arsenic LDD implant is approximately 1E13/cm2, and the boron P+ source/drain is approximately 2E15/cm2.

Clearly the sidewall oxide techniques will produce better controlled and much shorter N− extensions. Measurements have shown that substrate currents due to impact ionization can be reduced by up to a factor of 10, when the sidewall oxide technique is employed. All of the N-channel transistors will automatically incorporate LDD's.

Thus, the present invention is applicable not only to small-geometry but also to high-voltage processes, and can be widely modified and varied as will be appreciated by those skilled in the art.

At this point, the process steps described above to form lightly doped drain extension regions in the N-channel transistors are performed. That is, the LDD implant is applied overall, the P-type source/drain regions are implanted, and the N-type source/drain regions are then implanted, using a mask which offsets the N-type source/drain implant from the channel of the high-voltage N-type transistors. Note that the sequence of the LDD implant, the P+ source/drain implant, and the N+ source/drain implant is absolutely critical. However, the time at which the sidewall oxides are formed is not critical, as discussed below.

Note that the formation of lightly doped drain extension regions according to the present invention cannot be performed when source/drain counterdoping is used. Where source/drain counterdoping is possible, it is possible because the unpatterned P-type source/drain implant is compensated by the patterned N-type source/drain implant. However, the LDD regions do not receive the N-type source/drain implant, and therefore the P-type source/drain implant must be patterned to shield the LDD regions.

The second contact level is then patterned, using two resist coats if negative resist is being used. About a 500 nm thickness is wet etched, and the remainder is plasma etched. Plasma etching is required because of the different etch rats of PSG and plasma oxide.

Finally, 40 nm of plasma polysilicon is deposited, followed by 1200 nm of aluminum. The aluminum is then patterned, etched, an sintered, as shown in FIG. 8. 300 nm of plasma nitride is then deposited. The protective overcoat (POR) pattern is then applied, and the nitride is etched.

The present invention has been described with primary reference to a double-well epitaxial structure. However, it will be obvious to those skilled in the art that the present invention can also be applied where different means of preventing latch-up are used. For example, N-wells doped to about $10^{16}$ cm$^{-3}$ could be used in a substrate doped to $2 \times 10^{15}$ cm$^{-3}$ P-type. Although guard rings would be used in this case, the invention can be otherwise practices or described above.

The present invention is also applicable to N-cm-N+ CMOS processing, in which case the LDD regions are incorporated in the NMOS devices within the tanks.

An alternative, but similar, technique to that discussed above is where the sidewall oxide is in place along the edges of the P-channel gate before the P+ source/drain implant. In this case the P-channel devices should be masked (using the regular N+ source/drain mask) prior to the arsenic LDD implant so that none of the LDD implant enters the P-channel source/drain regions. After the masked LDD implant, the sidewall oxide is deposited and etched so that there is gate oxide underneath the sidewall oxide for both the P and N-channel devices. The P+ source/drain level is then patterned and BF2 implanted, so that it is self-aligned to the sidewall oxide edge. There is no P-type LDD or reachthrough implant. The relatively large lateral diffusion of boron causes the P+ source/drain to be aligned to the gate edge at the end of the process. The N+ source/drain level is then patterned, and the heavy arsenic N+ implant performed. Processing then continues as normal.

Note this method requires an extra mask step to prevent the LDD implant from entering the P-channel source/drain regions. It may be possible to eliminate this masking step and to rely on the boron source/drain implant to counterdope the arsenic LDD implant by lateral diffusion during the subsequent heat treatments. There is a large difference in doses: the arsenic LDD implant is approximately 1E13/cm2, and the boron P+ source/drain is approximately 2E15/cm2.

Clearly the sidewall oxide techniques will produce better controlled and much shorter N− extensions. Measurements have shown that substrate currents due to impact ionization can be reduced by up to a factor of 10, when the sidewall oxide technique is employed. All of the N-channel transistors will automatically incorporate LDD's.

Thus, the present invention is applicable not only to small-geometry but also to high-voltage processes, and can be widely modified and varied as will be appreciated by those skilled in the art.

In the principal embodiment of the lightly doped drain extension region formation as discussed above, sidewall oxides are left in place over the N-channel devices but not over the P-channel devices. However, it is slightly preferably for improved typography that sidewall oxides be present adjacent to the gates of the P-channel devices too, although it is preferable not to introduce lightly doped drain regions into he P-channel devices.

The presently preferred embodiment of the invention accomplishes this by performing the sidewall oxide formation at a slightly different point within the critical masking and implanting sequence discussed above. That is, in this embodiment, after all steps through patterning of the polysilicon gate level have been completed, the LDD implant is performed as a blanket implant. Next, photoresist is patterned according to the P-type source/drain mask, and the P+ source/drain implant is performed. Next, the P+ source/drain photoresist is removed, and conformal oxide is deposited overall and anisotropically etched to leave sidewall oxides on both N-channel and P-channel devices. Next, the N+ source/drain photoresist layer is patterned, and the N+ source/drain implant is performed. This sequence results in short lightly doped drain extensions on the source/drain regions of the N-type devices only and not on the P-type devices. However, sidewall oxides are present both on the N-type devices and also on the P-type devices. This configuration is slightly preferable, since the sidewall oxides improve typography. That is, step coverage over the edges of the first poly level in the PMOS areas is less of a problem.

The present invention is also particularly applicable to VLSI CMOS processes, i.e. to CMOS processes for less than 2 micron channel lengths. In such VLSI processes, the present invention modifies existing processes only in the sequence of steps at which the source/drain regions are formed. That is, the present invention can be incorporated in any CMOS process whatsoever, since its keypoint of novelty lies in the formation of the source/drain (and lightly doped drain extension) regions. The present invention will reduce the substrate current, but otherwise will not alter the parameters of the VLSI processes. Thus, as is well known to those skilled in the art, the dosages and energies of all implantations in the preceding process steps will be reduced substantially, according to any one of the many widely known VLSI CMOS process sequences.

Thus, the present invention provides an innovation in formation of source/drain regions which can be incorporated in any CMOS process sequence whatsoever, and the present invention can therefore be practices with a tremendous variety of modifications and variations, as will appreciated by those skilled in the art.

What is claimed is:

1. A method for fabrication of a CMOS device, comprising the steps of:
   (a) providing a semiconductor substrate;
   (b) defining moat regions at the surface of said substrate;
   (c) introducing N-type impurities into selected portions of said substrate to form a plurality of N-tank regions;
   (d) forming an insulated conductive gate layer over portions of said substrate to define a predetermined plurality of device locations within said moat regions, said device locations comprising both N-channel device locations and P-channel device locations:
   (e) introducing a light dose of N-type dopant into a shallow depth of said substrate surface overall, both in desired locations of lightly doped drain extension regions and in other locations;
   (f) depositing a conformal oxide overall;
   (g) providing a patterned mask layer to cover the locations of said N-channel devices, removing said conformal oxide where not covered by said masking layer, such that oxide is not present at the sidewalls of said gates over said P-channel locations, then introducing a heavy dose of P-type impurities to form P-type source/drain regions in predetermined locations where the surface of said substrate is exposed, and removing said first masking layer;
   (h) depositing a patterned masking layer to cover a plurality of said P-channel device locations, anisotropically etching said conformal oxide over said N-type device locations to leave sidewall oxides at the sidewalls of said gates over said N-type device locations, and implanting a high dose of an N-type impurity to form N-type sources and drains, whereby said N-channel devices comprise a lightly doped drain extension region separating said respective channel locations thereof; and
   (i) connecting said respective source/drain and gates to provide a desired circuit function;
   wherein all of step (e) is performed before (g), and all of step (g) is performed before step (h).

2. The method of claim 1, wherein said insulated conductive layer comprises a patterned conductive layer over a thin gate insulator, and said thin gate insulator is left in place during said lightly doped drain extension region implant.

3. A method for fabrication of a CMOS device, comprising the steps of:
   (a) providing a semiconductor substrate;
   (b) defining moat regions at the surface of said substrate;
   (c) introducing N-type impurities into selected portions of said substrate to form a plurality of N-tank regions;
   (d) forming an insulated conductive gate layer over portions of said substrate to define a predetermined plurality of device locations within said moat regions, said device locations comprising both N-channel device locations and P-channel device locations;
   (e) introducing a light dose of an N-type dopant into a shallow depth of said substrate surface overall, both in desired locations of lightly doped drain extension regions and in other locations; p1 depositing a conformal oxide overall;
   (f) providing a patterned first mask layer to cover the locations of said N-channel devices, removing said conformal oxide where not covered by said masking layer, such that oxide is not present at the sidewalls of said gates over said P-channel locations then introducing a heavy dose of P-type impurities to form P-type source/drain regions in predetermined locations where the surface of said substrate is exposed, and removing said first masking layer;
   (g) anisotropically etching said conformal oxide exposed by the removal of said first mask layer to leave sidewall oxides at the sidewalls of said gate layer over said N-channel device locations;
   (h) depositing a patterned second masking layer to cover a plurality of said P-channel device locations, and implanting a high dose of an N-type impurity to form N-type sources ad drains and removing said second masking layer, whereby said N-channel devices comprise a lightly doped drain extension region separating said respective source/drain regions thereof from said respective channel regions thereof; and
   (i) connecting said respective source/drain and gates to provide a desired circuit function;
   wherein all of step (e) is performed before step (f), and all of step (f) is performed before step (h).

4. A method for fabrication of a CMOS device, comprising the steps of:
   providing a semiconductor substrate;
   defining moat regions at the surface of said substrate;
   introducing impurities of a first conductivity type into selected portions of said substrate to form a plurality of tank regions;
   forming an insulated conductive gate layer over portions of said substrate to define a predetermined plurality of device locations within said moat regions, said device locations comprising both first device locations and second device locations;
   introducing a light dose of a dopant of said first conductivity type into a shallow depth of said substrate surface overall, both in desired locations of lightly doped drain extension regions and in other locations;
   depositing conformal oxide overall;
   anisotropically etching said conformal oxide to form gate sidewalls of said conformal oxide on said first device locations;
   providing a patterned first mask layer to cover the locations of said first devices, removing said conformal oxide where not covered by said masking layer, such that oxide is not present at the sidewalls of said gates over said second device locations, then introducing a heavy dose if impurities of a second conductivity type to form second conductivity type source/drain regions in predetermined locations where the surface of said substrate is exposed, and removing said first masking layer; then
   depositing a patterned second masking layer to cover a plurality of said second device locations, implanting a high dose of an impurity of said conductivity type to form first conductivity type sources and drains and removing said second masking layer, whereby said first devices comprise a lightly doped drain extension region separating said respective source/drain regions thereof from said respective channel regions thereof; and connecting said respective source/drain and gates to provide a desired circuit function.

5. A method for fabrication of a CMOS device, comprising the steps of:

providing a semiconductor substrate;

defining moat regions at the surface of said substrate;

introducing N-type impurities into selected portions of said substrate to form a plurality of N-tank regions;

forming an insulated conductive gate layer over portions of said substrate to define a predetermined plurality of device locations within said moat regions, said device locations comprising both N-channel device locations and P-channel device locations;

introducing a light dose of an N-type dopant into a shallow depth of said substrate surface overall, both in desired locations of lightly doped drain extension regions and in other locations;

depositing a conformal oxide overall;

anisotropically etching said conformal oxide layer to form gate sidewalls of said conformal oxide on said N-channel device locations;

providing a first patterned mask layer to cover the locations of said N-channel devices, removing said conformal oxide where not covered by said masking layer, such that oxide is not preset at the sidewalls of said gates over said second device locations, the introducing a heavy dose of P-type impurities to form P-type source/drain regions in predetermined locations where the surface of said substrate is exposed, and removing said first masking layer; and then depositing a second patterned masking layer to cover a plurality of said P-channel device locations, implanting a high dose of an N-type impurity to form N-type sources and drains and removing said second masking layer, whereby said N-channel devices comprise a lightly doped drain extension region separating said respective source/drain regions thereof from said respective channel regions thereof.

* * * * *